United States Patent [19]

Yamaoka

[11] Patent Number: 5,025,552
[45] Date of Patent: Jun. 25, 1991

[54] METHOD OF MANUFACTURING ION CURRENT RECORDING HEAD

[75] Inventor: Toshihide Yamaoka, Akishima, Japan

[73] Assignee: Olympus Optical Co., Ltd., Tokyo, Japan

[21] Appl. No.: 417,025

[22] Filed: Oct. 4, 1989

[30] Foreign Application Priority Data

Oct. 11, 1988 [JP] Japan .................... 63-255225

[51] Int. Cl.$^5$ ............................ H01R 43/00
[52] U.S. Cl. .................... 29/825; 219/121.7; 219/121.71; 346/159; 427/97; 430/53
[58] Field of Search .......................... 29/825; 427/97; 219/121.7, 121.71; 346/159; 430/53

[56] References Cited

U.S. PATENT DOCUMENTS

| | | | |
|---|---|---|---|
| 3,410,979 | 11/1968 | Larsson | 219/121.7 X |
| 4,258,468 | 3/1981 | Balde | 427/97 X |
| 4,262,186 | 4/1981 | Provancher | 219/121.7 X |
| 4,642,160 | 2/1987 | Burgess | 427/97 X |
| 4,647,476 | 3/1987 | Anthony | 219/121.7 X |
| 4,827,328 | 5/1989 | Ozawa et al. | 427/97 |

FOREIGN PATENT DOCUMENTS

| | | | |
|---|---|---|---|
| 164564 | 12/1985 | European Pat. Off. | 219/121.71 |
| 55-33886 | 3/1980 | Japan | 219/121.7 |
| 60-124487 | 7/1985 | Japan | 219/121.71 |
| 61-224487 | 10/1986 | Japan . | |
| 61-224489 | 10/1986 | Japan . | |
| 61-224490 | 10/1986 | Japan . | |
| 62-3889 | 1/1987 | Japan | 219/121.71 |
| 3017543 | 1/1988 | Japan | 427/97 |

Primary Examiner—Carl J. Arbes
Attorney, Agent, or Firm—Frishauf, Holtz, Goodman & Woodward

[57] ABSTRACT

First and second electrodes are formed on a pair of opposite surfaces of a polyimide film. The first and second electrodes respectively have a large number of small holes which oppose each other through the polyimide film. An excimer laser beam is radiated on one of the first and second electrodes. A portion of the excimer laser beam radiated on the electrodes is reflected by the electrode surfaces. The remaining portion of the laser beam radiated inside the holes of the electrodes disconnects the chemical bond of the polyimide without generating heat. As a result, holes each having a sectional shape defined by a corresponding hole fomed in the electrodes are formed in the solid insulating body.

2 Claims, 5 Drawing Sheets

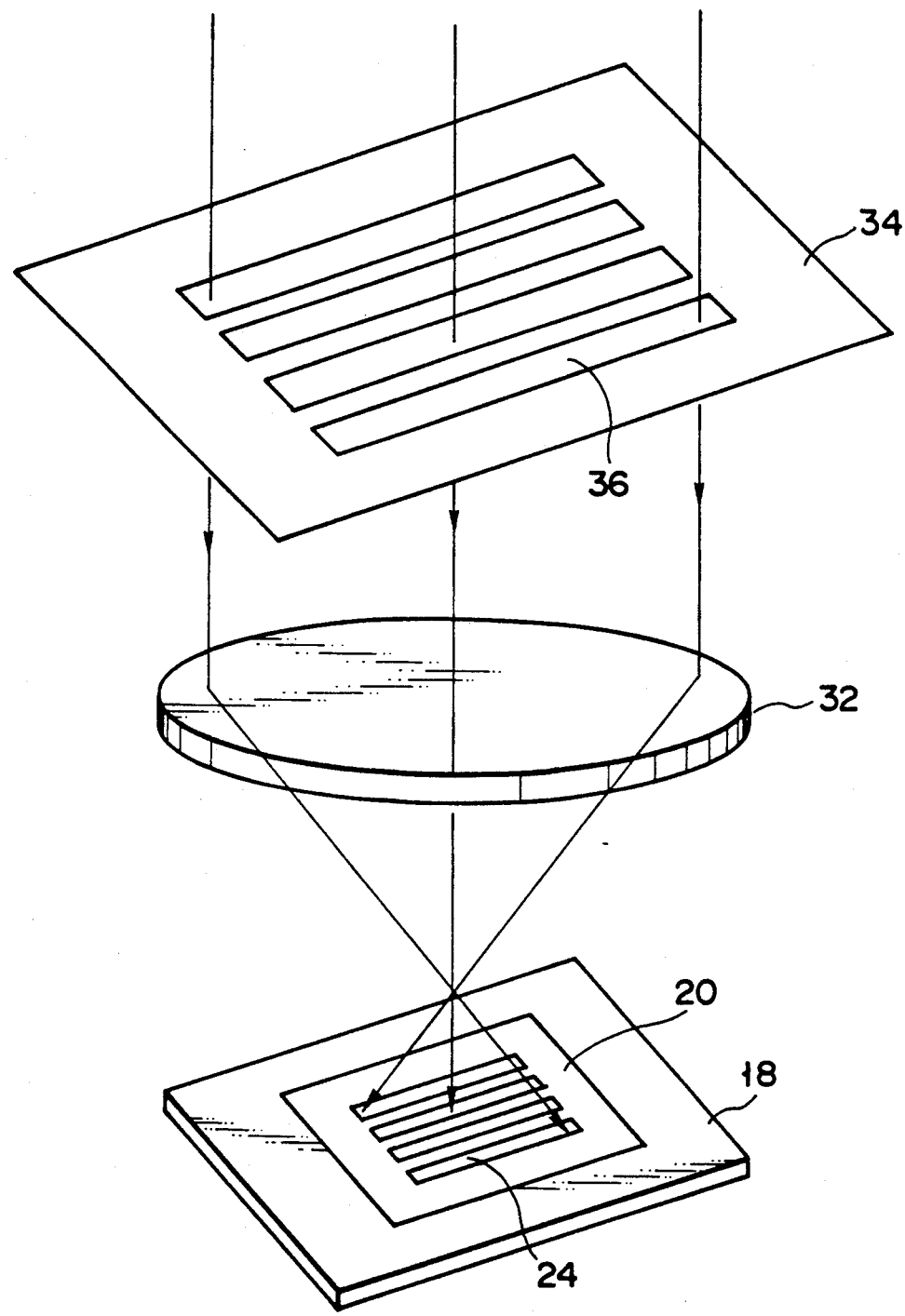
F I G. 4

METHOD OF MANUFACTURING ION CURRENT RECORDING HEAD

BACKGROUND OF THE INVENTION

1. Field of the Invention

The present invention relates to a method of manufacturing an ion current recording head used as a recording head of an electrostatic plotter or the like.

2. Description of the Related Art

An ion current recording head basically comprises an ion source and an ion current control member for controlling the flow of ions. The ion current control member is obtained by forming a large number of small holes for allowing ion currents to pass therethrough in a printed circuit board constituted by a solid insulating body having electrodes arranged on its upper and lower surfaces. Ions generated by the ion source pass through the ion through holes of the ion control member and are radiated on a recording medium. At this time, a predetermined voltage pulse is applied to the electrodes on the upper and lower surfaces of the ion current control member so as to change the direction and intensity of an electric field in each small hole, thus controlling the amount of ions passing therethrough. As a result, a desired electrostatic latent image is recorded in the recording medium, and is developed later to form a desired image.

In such a recording head, in order to form a uniform image, a large number of ion through holes are required to have uniform size and shape. This causes great difficulty in the manufacture of an ion current recording head. The larger the width of an image to be formed, to which a recording head is applied, the greater the difficulty in manufacture. For example, a recording head to be applied to formation of an A$\phi$ image having a width of 840 mm at a recording density of 8 dot/mm is required to have at least 6,720 uniform ion through holes. In addition, a head to be applied to gray scale recording requires higher precision. For example, in a head to be applied to 64-level recording, a variation in area of ion through holes must be 1.5% or less.

As a method of forming ion through holes in a printed board, Published Unexamined Japanese Patent Application No. 61-224487 discloses a method of forming holes in a board using a microdrill having a diameter of 100 to 300 $\mu$m. The method of forming ion through holes by means of drilling takes a very long period of time to form a large number of ion through holes. In addition, burrs are produced at the opening of the metal electrodes, and the positional precision of the holes is low. Furthermore, if a drill is broken on the course of formation of a large number of ion through holes, an incompleted recording head cannot be used any more, and the previous process is wasted. Moreover, since a small-diameter microdrill to be used has poor durability, early replacement of the microdrill is required, resulting in an increase in cost.

As another method, Published Unexamined Japanese Patent Application Nos. 61-224489 and 61-224490 disclose a method of forming ion through holes in a printed circuit board by etching. In a normal printed board, a copper film is bonded to an insulating board with an adhesive agent. As this adhesive agent, a material having high etching resistance is mainly used. Consequently, an adhesive agent having high etching resistance is interposed between a board and a copper film. As a result, ion through holes cannot be formed in the printed board depending on a type of etching. According to another available board, a thin metal film is formed on an insulating board by sputtering without using an adhesive agent. In a board of this type, however, since adhesion between a metal film and the board is small, the metal film may be peeled off when soldering is performed to connect an electric circuit system to a recording head, a connector is inserted, or etching is performed.

An adhesion-reinforced sputtering board is available as another board using no adhesive agent. This board has large adhesion between a thin metal film and an insulating board. As such a board, a polyimide board with a copper film is available from Mitsui Mining & Smelting Co. Ltd., which is obtained by forming a copper film on a polyimide board. When this board is immersed in an etching solution, the polyimide board is isotropically etched from portions exposed by a small hole pattern formed in the copper film. More specifically, the exposed portions are etched, from the upper and lower surfaces of the polyimide board, in almost semispherical shapes having the holes formed opposite in the upper and lower surfaces as the centers. Therefore, the inner surface of each ion through hole formed in this manner is not flat but has a ring-like projection midway along each hole. In addition, each portion under the metal pattern is etched to have a larger diameter than a corresponding hole of the pattern. For this reason, if etching is insufficiently performed, a portion of the polyimide board is left midway along each through hole in the form of a ring. When such a board is used as a recording head, this ring-like portion is charged with ions to cause reduction in ion current. If etching is excessively performed, copper films around the through holes collapse. As a result, electric fields may be changed when a voltage plus is applied to the electrodes, or the electrodes on the upper and lower surfaces may be short-circuited. In addition, the use of a special sputtering board such as a polyimide board with a copper film causes an increase in cost. Moreover, the shape of each ion through hole to be formed by etching is greatly influenced by the direction, flow rate, and temperature of an etching solution, and it is impossible to set these conditions to be the same for each hole. Hence, holes having different shapes are inevitably formed.

Micropatterning using laser heat is employed as a means for forming through holes in an insulating body (polyimide board). Hole formation in an insulating body was actually performed by using a YAG laser and a $CO_2$ laser. In hole formation using an $Al_2O_3$ ceramic board, $Al_2O_3$ melted by heat was scattered around each hole to produce burrs. In hole formation using a polyimide board, holes were formed into indefinite shapes due to heat fusion, and hence the resultant structure was not suitable for practical use.

SUMMARY OF THE INVENTION

It is an object of the present invention to provide a method of manufacturing an ion current recording head, in which a large number of ion through holes having a uniform shape can be easily formed in a solid insulating body with high precision.

According to the present invention, there is provided a method of manufacturing an ion current recording head, comprising the steps of forming first and second electrodes on opposite surfaces of a solid insulating body, forming a plurality of small holes in the first and second electrodes so as to oppose each other through the solid insulating body, and radiating an excimer laser beam on one of the first and second electrodes having the plurality of small holes.

In addition, according to the present invention, there is provided a method of manufacturing an ion current recording head, comprising the steps forming first and second thin metal films on opposite surfaces of a solid insulating body, forming a plurality of small holes in the first and second thin metal films so as to oppose each other through the solid insulating body, radiating an excimer laser beam onto one of the first and second thin metal films, and patterning the thin metal films.

BRIEF DESCRIPTION OF THE DRAWINGS

FIG. 4 is a view showing an arrangement of an optical system used in the second embodiment of the present invention;

DETAILED DESCRIPTION OF THE PREFERRED EMBODIMENTS

A method of manufacturing an ion current recording head of the present invention will be described below with reference to the accompanying drawings.

Figure 1:
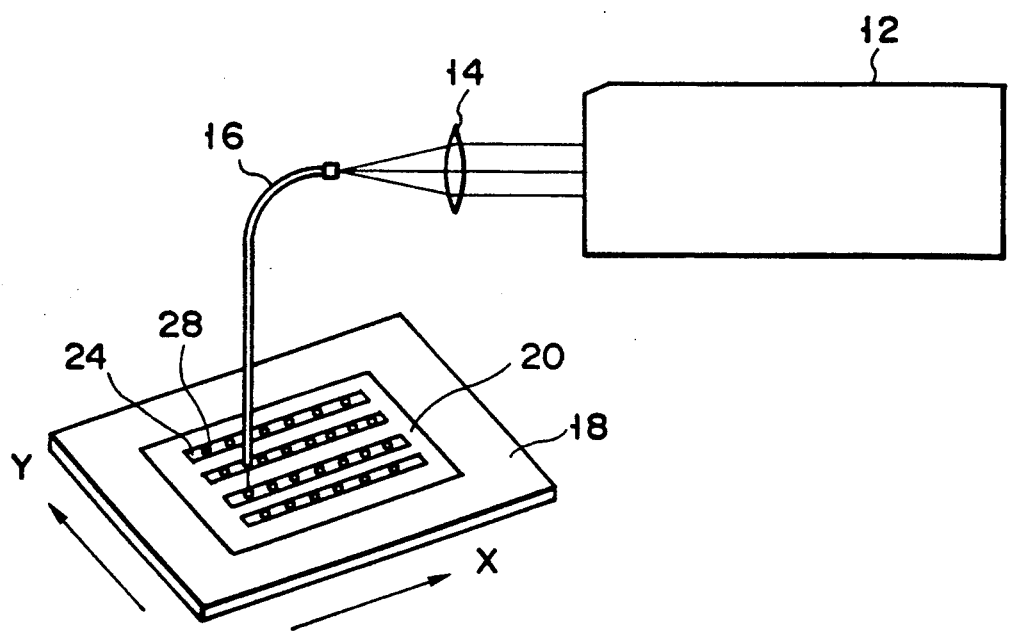
FIG. 1 is a view showing an arrangement of an apparatus used in the present invention.

FIG. 1 shows an arrangement of an apparatus used in the present invention. The apparatus basically comprises an optical system for radiating a laser beam on a board 20, and an X-Y stage 18 for moving the board 20. The optical system includes an excimer laser 12, a lens 14, and an optical fiber 16. A laser beam generated by the excimer laser 12 is focused by the lens 14 and is guided into the optical fiber 16. The laser beam is then guided to the board 20 by the optical fiber 16. The excimer laser 12 includes an ArF laser (wavelength: 193 nm), a KrF laser (wavelength: 248 nm), an Xef laser (wavelength: 308 nm), and the like which are selectively used in accordance with a type of an insulating body constituting the board 20.

Figure 2:
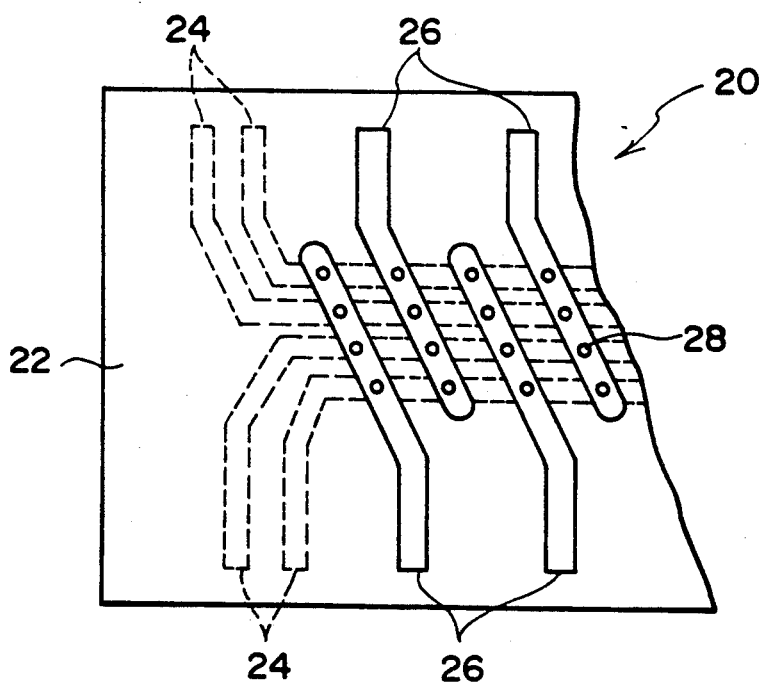
FIG. 2 is a view showing an electrode pattern of a polyimide board.

The board 20 has a base plate consisting of a polyimide film (e.g., Capton, trade name, available from Du Pont de Nemours, E.I., Co.) having a thickness of about 125 $\mu$m. Four first electrodes 24 are formed on one surface of the board 20 so as to extend in its longitudinal direction, and 160 second electrodes 26 are formed on the other surface so as to obliquely cross the first electrodes 24. FIG. 2 shows this state, and FIG. 1 shows only the first electrodes 24. These electrodes 24 and 26 are formed in such a manner that 18-$\mu$m thick copper films are bonded to the upper and lower surfaces of the polyimide film by using an adhesive agent (e.g., Pyralax, trade name, available from De Pont de Nemours, E.I., Co.), an electrode pattern shown in FIG. 2 is formed, and the formed pattern is plated with Ni. Each of the first and second electrodes 24 and 26 has a width of 400 $\mu$m. The distance between the adjacent first electrodes 24 is about 100 $\mu$m. Small holes 28 each having a diameter of 200 $\mu$m are formed in regions where the first and second electrodes 24 and 26 cross each other through a polyimide film 22 at opposite positions. These small holes 28 are formed by photolithography, i.e., patterning the electrodes with a photoresist, and thereafter performing etching. In this method, small holes can be formed with a precision of 1 $\mu$m level.

The X-Y stage 18 is controlled by a computer which stores position data of the small holes 28 formed in the first and second electrodes 24 and 26. The X-Y stage 18 is finely moved by a stepping motor so that the laser beams are radiated to only the small holes 28.

Figure 3A:
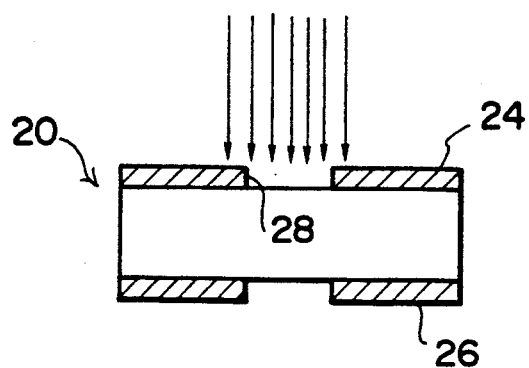
FIGS. 3A and 3B are views showing a process of removing a solid insulating body by using an excimer laser.
Figure 3B:
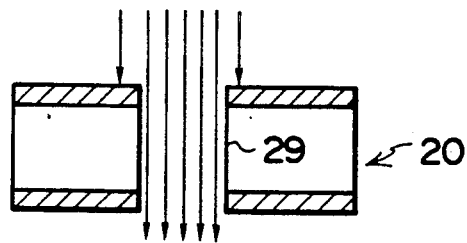

An excimer laser beam which is output upon excitation of the excimer laser 12 is focused by the lens 14 and is guided to the glass fiber 16. The laser beam propagating in the fiber 16 is shaped into a beam having a diameter of about 210 $\mu$m and is output from the distal end of the fiber 16 perpendicularly to the X-Y stage 18. At this time, the X-Y stage 18 is moved in accordance with the position data of the small holes 28 stored in the computer so as to place each small hole 28 formed in the first electrode 24 on the board 20 placed on the X-Y stage 18 to a position immediately below the distal end of the fiber 16. With this operation, as shown in FIG. 3A, the excimer laser beam is radiated on only the hole 28 of the first electrode 24 and its adjacent portion. A portion of the laser beam radiated outside the hole is reflected by the electrode, whereas the remaining portion of the laser beam radiated inside the hole directly disconnects the chemical bond of the polyimide film 22 without generating heat. As a result, an ion through hole 29 having the same diameter as that of the hole 28 and extending through the polyimide film 22 is formed, as shown in FIG. 3B. The board 20 is sequentially and intermittently moved by the X-Y stage 18, and a laser beam is radiated on only each hole 28 of the first electrodes 24. This operation is repeated until a laser beam is radiated on all the holes 28 of the first electrodes 24.

Since the ion through holes 29 are formed by radiating an excimer laser beam on the holes 28 in this manner, and the diameter of each hole 29 is defined by a corresponding hole 28, a large number of ion through holes 29 having a uniform shape can be easily formed in the polyimide film 22 as a solid insulating body. Therefore, a high-performance ion current recording head can be formed.

The second embodiment of the present invention will be described below with reference to FIG. 4. As shown in FIG. 4, in this embodiment, a mask 34 for selecting a laser beam and a lens system 32 for focusing selected laser beams are arranged at the input stage of a board 20.

Similar to the first embodiment, the board 20 comprises electrodes 24 and 26 shown in FIG. 2. Each hole formed in the first electrodes 24 has a diameter of 205 $\mu$m which is slightly larger than the diameter (200 $\mu$m) of each hole formed in the second electrodes 26. The board 20 is placed on an X-Y stage 18 with the first electrodes 24 facing up. A laser beam generated by an excimer laser is radiated onto the mask 34 having rectangular slits 36. Selected laser beams passed by the slits 36 are focused by the lens system 32 and are radiated onto the first electrodes 24 of the board 20 on an X-Y stage 18. All the holes of the first electrodes 24 are simultaneously irradiated with the excimer laser beams, and 640 ion through holes are formed at once. The ion through holes formed in this manner have slightly different longitudinal sectional shapes because the incidence angles of the laser beams vary depending on the positions of the holes. However, if the second electrode side is placed near an ion source when the obtained board is applied to a recording head, all the projected shapes of the through holes have a diameter of 200 $\mu$m.

In this embodiment, since laser beams are simultaneously radiated on the electrodes, the operation efficiency is greatly improved.

Figure 5:
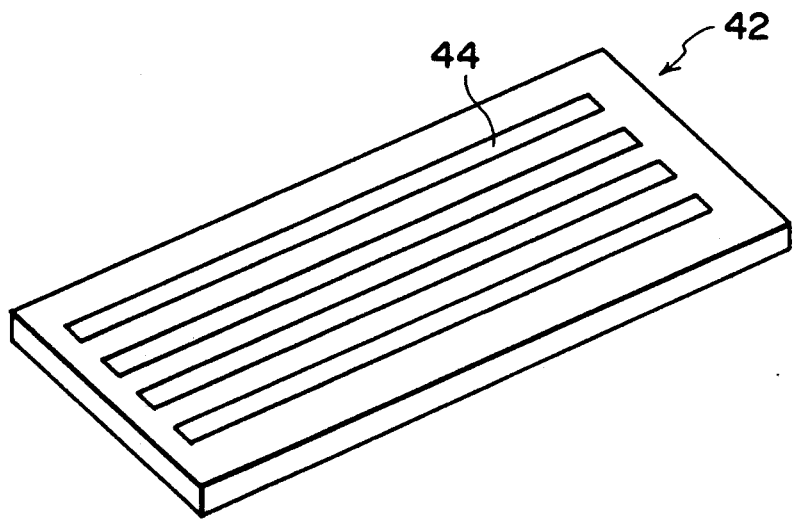
FIG. 5 is a perspective view showing a mask placed on a board according to the third embodiment of the present invention.

The third embodiment of the present invention will be described below. In this embodiment, a mask 42 shown in FIG. 5 is directly placed on a board 20, and a laser beam is radiated onto the mask 42 so as to form ion through holes.

The mask 42 is constituted by a stainless steel plate having four 230-$\mu$m wide, 90-mm long slits 44. The mask 42 is placed on the board mounted on an X-Y stage 18. In this case, the mask 42 is placed such that the holes of first electrodes 24 are positioned at the centers of the slits 44, respectively. Subsequently, a 2.5-mm wide excimer laser beam is radiated onto the board 20, and at the same time the board 20 is moved by the X-Y stage 18 in its longitudinal direction. With this operation, the laser beam is simultaneously radiated on the four parallel first electrodes 24, and four rows of ion through holes are simultaneously formed.

In this embodiment, the mask 42 having the slits 44 is placed on the board. Instead of placing the mask on the board, however, a material which is inert or has low activity with respect to an excimer laser beam may be coated on portions of the board requiring a mask by screen printing. Alternatively, a fluorine plastic film having resistance to an excimer laser beam may be bonded to the board as a cover film.

Figure 6:
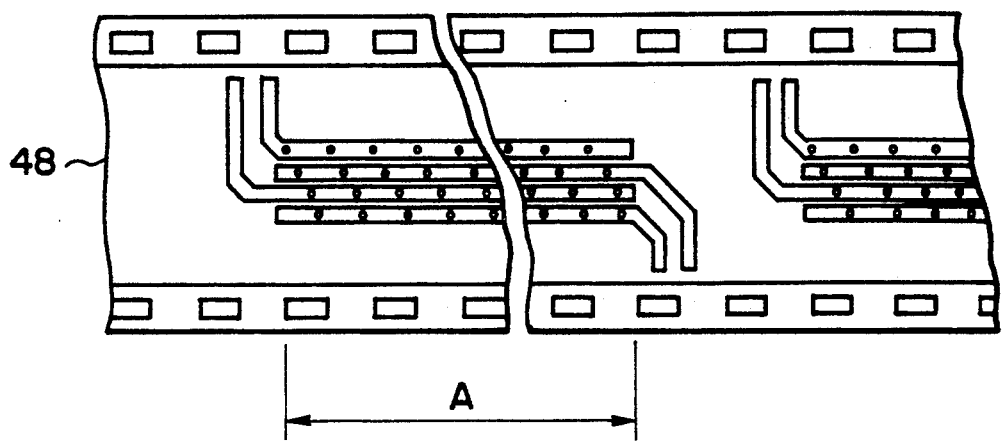
FIG. 6 is a plan view showing a tape having an electrode pattern used in the fourth embodiment of the present invention.

The fourth embodiment of the present invention will be described below. In this embodiment, a 70-mm wide polyimide tape 48 is used as a board. FIG. 6 shows the tape 48 on which a large number of first and second electrode patterns similar to those of the above-described embodiment are formed at predetermined intervals. In FIG. 6, only the first electrodes are shown, and an ion through hole formation region corresponding to one recording head is denoted by reference symbol A.

Figure 7:
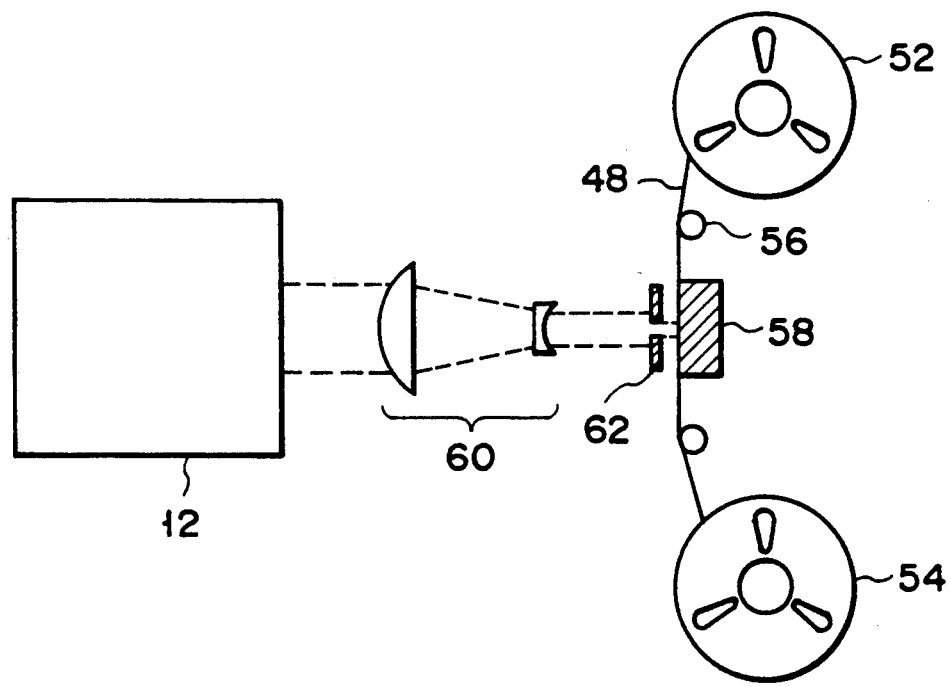
FIG. 7 is a view showing an arrangement of an apparatus for radiating an excimer laser beam onto the tape shown in FIG. 6.
Figure 8:
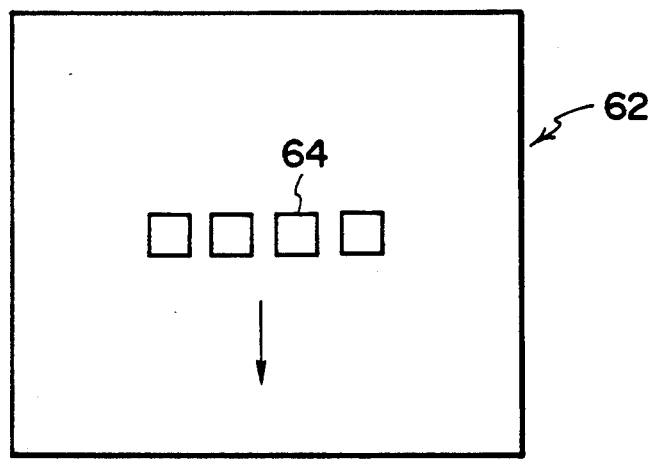
FIG. 8 is a plan view showing a slit used in the apparatus shown in FIG. 7.

FIG. 7 shows an arrangement of an apparatus for radiating an excimer laser beam onto the tape 48. The tape 48 is wound around a reel 52 and is taken up by a take-up reel 54 through a capstan roller 56 and a tape hold member 58. A lens system 60 for focusing a laser beam and a slit 62 for selectively radiating a laser beam onto the tape are arranged between the tape 48 and an excimer laser 12. As shown in FIG. 8, the slit 62 includes four square openings 64 each having a side of 210 $\mu$m The four openings 64 are aligned at certain intervals. The pitch of the openings 64 is equal to that of the four parallel electrodes arranged on the tape 48. Referring to FIG. 8, an arrow indicates the travel direction of the tape 48. With this arrangement, laser beams passing through the openings 64 are radiated onto the electrodes of the tape 48.

The tape 48 is taken up by the reel 54 to travel. When the ion through hole formation region A of the electrodes on the tape 48 reaches a position below the slit 62, a laser beam is generated by the excimer laser 12. The laser beam is focused by the lens system 60 and is radiated onto the holes of the four electrodes arranged on the tape 48 through the slit 62. As a result, ion through holes each having the same diameter of that of a corresponding hole formed in the electrodes are formed. Radiation of the excimer laser beam is continued until through holes are completely formed in the ion through hole formation region A of the electrodes. Ion through holes corresponding to one recording head are formed upon one laser beam radiation. According to this embodiment, elongated ion current recording heads can be mass-produced.

Figure 9:
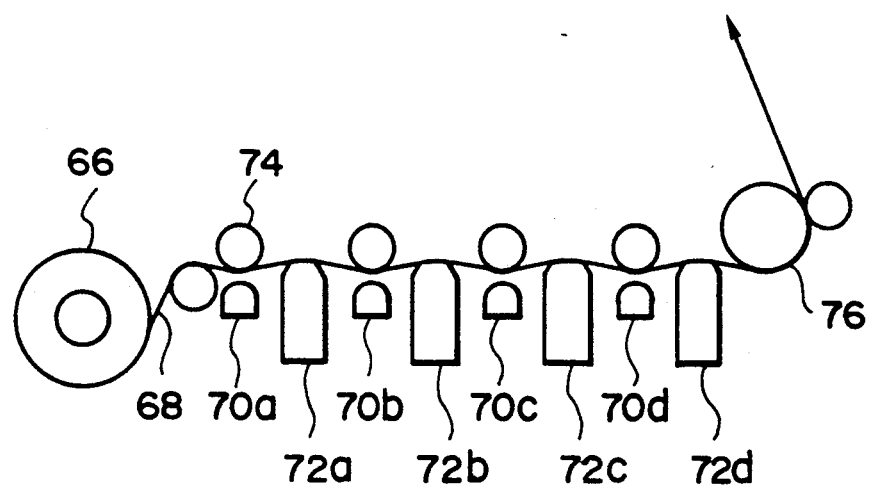
FIG. 9 is a view showing an arrangement of an electrostatic color plotter.

A case wherein an ion current recording head manufactured in this manner is applied to an electrostatic color plotter will be described below with reference to FIG. 9. Electrostatic recording paper 68 supplied from an electrostatic recording paper roll 66 is fed to four ion current recording heads 70a to 70d. The recording heads 70a to 70d respectively record yellow, magenta, cyan, and black electrostatic latent images on the recording paper 68. The electrostatic latent images are respectively developed by suction type developing heads 72a to 72d. The recording paper 68 on which a color image obtained by overlapping the four colors is conveyed from a convey roller 76.

If an image is formed by a color plotter using ion current recording heads, no abnormal discharge occurs in contrast to catwhisker recording. In addition, since electrostatic latent images can be formed in non-contact state with respect to recording paper, electrostatic recording paper, which has predetermined coarseness so as to ensure stable discharge, need not be used in contrast to catwhisker recording. Hence, a fog phenomenon which occurs when a toner flows in recesses of recording paper can be prevented. Even if electrostatic recording paper having a very smooth surface, e.g., art paper, is used, a clear image can be easily recorded.

The present invention is not limited to the above-described embodiments. In the above embodiments, a laser beam is radiated onto each board on which the electrode patterns are formed. However, electrodes may be formed after ion through holes are formed. More specifically, copper films are bonded to the two surfaces of a polyimide board, holes are formed at predetermined positions of the copper films by etching, and an excimer laser beam is radiated on the entire surface of the board so as to form ion through holes. Thereafter, electrodes are formed by lithography. In addition, any material can be used as a solid insulating body as long as it is active with respect to an excimer laser beam. Instead of a polyimide, therefore, other plastic materials or ceramic materials may be used. Moreover, the material of the first and second electrodes is not limited to copper. Nickel, chromium, aluminum, gold, silver, and their alloys may be used. Also, these metals may be plated.

What is claimed is:

1. A method of manufacturing an ion current recording head having a plurality of small through holes for allowing passage of ions and adapted to control an ion current flowing through the respective small through holes by controlling an electric field in the respective small through holes, comprising the following steps in the sequence of:

forming first and second thin metal films on opposite surfaces of a solid insulating body;
  forming a plurality of small holes in said first and second thin metal films so as to oppose each other through said solid insulating body;
  radiating an excimer laser beam onto one of said first and second thin metal films to form the small through holes in the solid insulating body which each allow passage therethrough of the ion current; and
  patterning said thin metal films.

2. A method of manufacturing an ion current recording head having a large number of small holes for allowing passage of an ion current therethrough and adapted to control the ion current flowing through the respective small holes by controlling an electric field in the respective small holes, comprising the steps of:

providing an insulating tape with a pattern of a plurality of electrodes formed on opposite surfaces of said tape, said pattern being placed at predetermined intervals along the length of said tape;
  positioning an excimer laser and a lens system for focusing a beam from the excimer laser on said tape;
  placing a mask between the tape and the laser, said mask having a plurality of openings aligned so as to pass said beam to said electrodes in the pattern;
  selectively radiating the excimer laser beam through the slit and on the insulating tape; and
  forming a plurality of through holes in the insulating tape with small holes of the electrodes as a mask pattern for the excimer laser beam radiating on said tape.

* * * * *